(12) United States Patent
Kimura

(10) Patent No.: US 6,954,508 B2
(45) Date of Patent: Oct. 11, 2005

(54) AUTOMATIC FREQUENCY CONTROL SYSTEM ADAPTED TO COMPENSATE FOR AN INSUFFICIENT CAPTURE RANGE

(75) Inventor: Koji Kimura, San Diego, CA (US)

(73) Assignees: Sony Corporation, Tokyo (JP); Sony Electronics Inc., Park Ridge, NJ (US)

(*) Notice: Subject to any disclaimer, the term of this patent is extended or adjusted under 35 U.S.C. 154(b) by 791 days.

(21) Appl. No.: 09/920,783

(22) Filed: Aug. 1, 2001

(65) Prior Publication Data
US 2003/0026362 A1 Feb. 6, 2003

(51) Int. Cl.[7] .............................................. H04L 27/06
(52) U.S. Cl. ...................................................... 375/344
(58) Field of Search ................................. 375/226, 224, 375/316, 325, 340, 344, 358, 145, 149, 141, 140, 130, 147, 326, 324

(56) References Cited

U.S. PATENT DOCUMENTS 6,067,332 A * 5/2000 Taura et al. ................. 375/344
6,249,539 B1 * 6/2001 Harms et al. ................ 375/130
6,553,064 B1 * 4/2003 Chen et al. .................. 375/224
6,760,393 B1 * 7/2004 Alisobhani et al. ......... 375/365

* cited by examiner

Primary Examiner—Tesfaldet Bocure
Assistant Examiner—Pankaj Kumar
(74) Attorney, Agent, or Firm—Blakely, Sokoloff, Taylor & Zafman LLP (57) ABSTRACT

An automatic frequency control (AFC) system adapted to compensate for an insufficient capture range is described herein. The AFC system may be implemented in a mobile station for use with a wireless communications system such as code division multiple access (CDMA). The AFC system determines if a transmission frequency is within a capture range. The AFC system modifies a reference frequency generated by the mobile station if the transmission frequency is not within the capture range.

27 Claims, 6 Drawing Sheets

AUTOMATIC FREQUENCY CONTROL SYSTEM ADAPTED TO COMPENSATE FOR AN INSUFFICIENT CAPTURE RANGE

FIELD OF THE INVENTION

This invention relates generally to automatic frequency control (AFC) systems in spread spectrum systems, and more particularly to an AFC system that detects a clock frequency that is outside of an AFC capture range and adjusts the clock frequency so that it falls within the AFC capture range.

COPYRIGHT NOTICE/PERMISSION

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright © 2000, Sony Electronics Inc., All Rights Reserved.

BACKGROUND

Wireless communications systems that employ spread spectrum technology, such as code division multiple access (CDMA) systems, transmit multiple calls within a single cell over a single carrier. CDMA systems use codes, rather than allocated times or frequencies, to distinguish between calls. CDMA 2000 1x and 3x systems encode calls using a Walsh code and pseudo-noise (PN) sequences. The Walsh code is used to distinguish one call from other calls transmitted from the same base station over the single carrier. Pseudo-noise (PN) sequences are used to distinguish one base station from other base stations. The PN sequences are also used to increase the bandwidth of signal transmitted by the base station. The increased bandwidth results in a number of advantages unique to spread spectrum systems, including improved call quality, increased call capacity, and enhanced security.

A base station encodes a call by modulating a digitized voice signal with a Walsh code and with in-phase pseudo-noise (I-PN) and quadrature-phase pseudo-noise (Q-PN) sequences. The base station then transmits a carrier signal containing multiple encoded calls. To receive a call, a mobile station must receive the carrier signal and multiply it with the correct Walsh code and PN sequences to filter out the desired voice signal. The mobile station must generate the same Walsh code and PN sequences as those in the carrier signal, and must adjust the frequency of the Walsh code and PN sequences generated by the mobile station to match those in the carrier signal.

A clock in the mobile station, such as a voltage-controlled temperature-compensated crystal oscillator (VCTCXO), controls the frequency of the Walsh code and PN sequences generated by the mobile station. The mobile station adjusts the frequency of the VCTCXO by a process called automatic frequency control (AFC). A rotation of signal constellation of in-phase and quadrature-phase outputs of a correlator in the mobile station indicates frequency error between the clock in the mobile station and the clock in the base station. In-phase correlator (I-C) output and quadrature-phase correlator (Q-C) outputs are determined for a chip length of, for example, 256 chips. The I-C and Q-C outputs for successive chip lengths may be plotted to illustrate the signal constellation. If there is no frequency error between the mobile station and the base station, the signal constellation remains stationary. However, if there is a frequency error, the signal constellation rotates around the origin.

Figure 1:
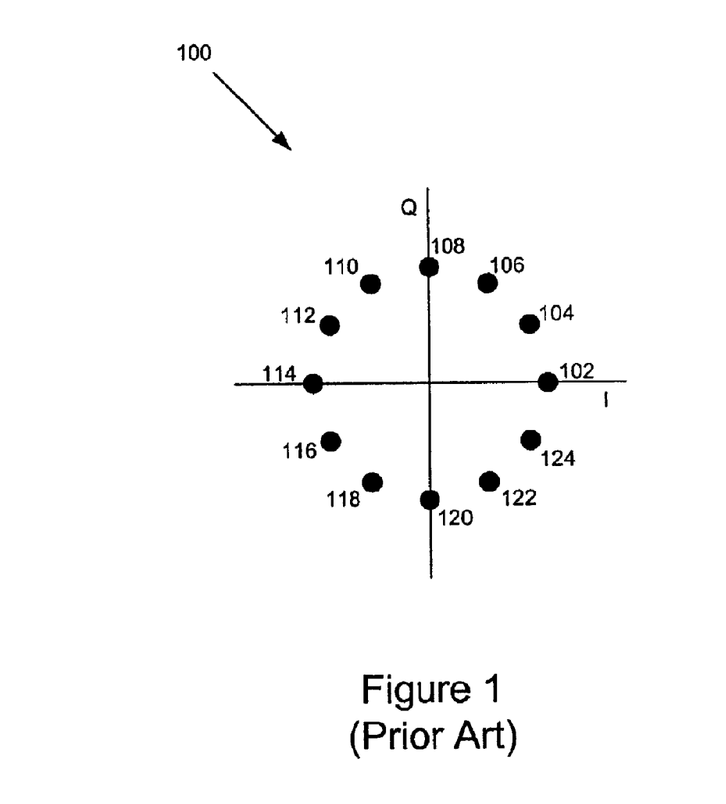
FIG. 1 illustrates one embodiment of correlator outputs for a signal constellation.

FIG. 1 illustrates an example of a signal constellation 100 when there is a frequency error between the received signal and the reference signal. Correlator outputs 102 through 124 represent plots of the I-C and Q-C outputs after successive chip lengths. For example, correlator output 102 may represent a plot of the I-C and Q-C outputs after 256 chips. Correlator output 104 may represent a plot of the in-phase and quadrature-phase correlator outputs after another 256 chips. Due to the frequency error, correlator outputs 102 through 124 rotate around the origin.

Figure 2:
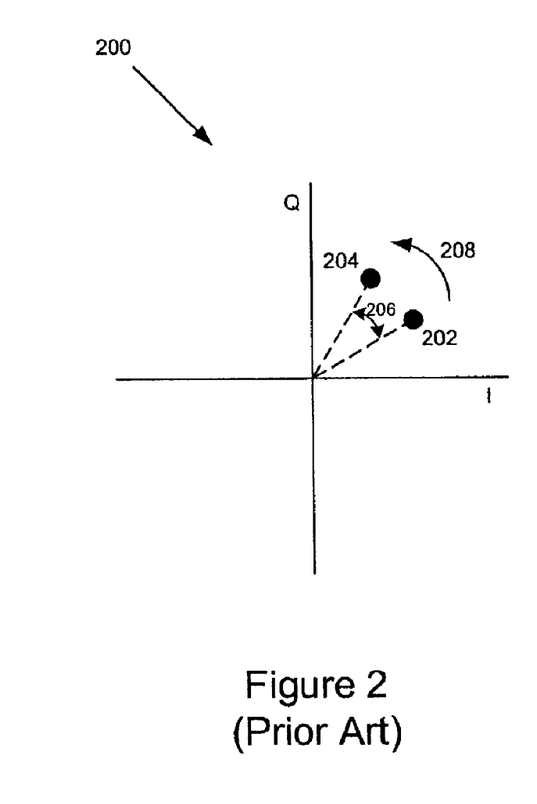
FIG. 2 illustrates one embodiment of an angle of rotation and a direction of rotation of a signal constellation.

The angle of rotation of signal constellation 100 is proportional to the frequency error between the CDMA signal and the reference signal. The direction of rotation of the signal constellation indicates whether the reference frequency of the VCTCXO is too fast or too slow. AFC uses the angle of rotation and the direction of rotation of the signal constellation to estimate the frequency error between the carrier signal and the reference signal and to adjust the frequency of the reference signal accordingly. FIG. 2 illustrates the angle of rotation 206 and the direction of rotation 208 of a signal constellation 200 when there is a frequency error between the CDMA signal and the reference signal. Correlator outputs 202 and 204 may correspond to correlator outputs 102 and 104 in FIG. 1 calculated after successive correlation lengths. AFC adjusts the reference frequency of the VCTCXO until angle of rotation 206 becomes zero.

AFC works well in CDMA systems that have a wide capture range, such as IS-95. However, AFC has difficulties in CDMA systems that have narrower capture ranges, such as CDMA 2000 1x and CDMA 2000 3x. The capture range of a CDMA system can be calculated using the following formula:

$$|\Delta| < \frac{f_{chip}}{2N \cdot f_{center}}$$

where $\Delta$ is the capture range, $f_{chip}$ is the chip rate of the PN sequences, N is the correlation length, and $f_{center}$ is the center frequency of the base station transmitter. Using typical approximate values for a CDMA 2000 3x system, $f_{chip}$ equals 1,228,800, N equals 256, and $f_{center}$ equals 2,100,000. Therefore, for a typical CDMA 2000 3x system:

$$|\Delta| < 1.1 \times 10^{-6}$$

In other words, the capture range for a typical CDMA 2000 3x system is approximately 1.1 ppm.

Figure 3:
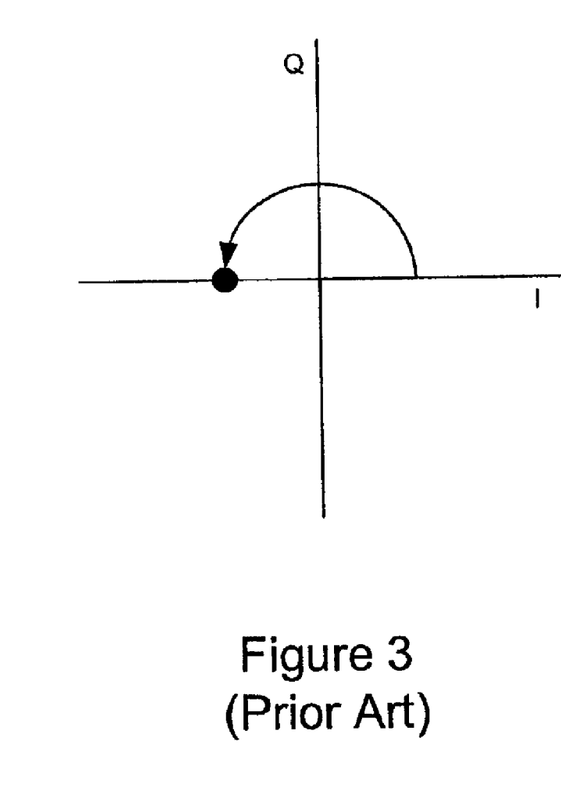
FIG. 3 illustrates one embodiment of a signal constellation for a CDMA system in which the angle of rotation is one hundred eighty degrees (180°)
Figure 4:
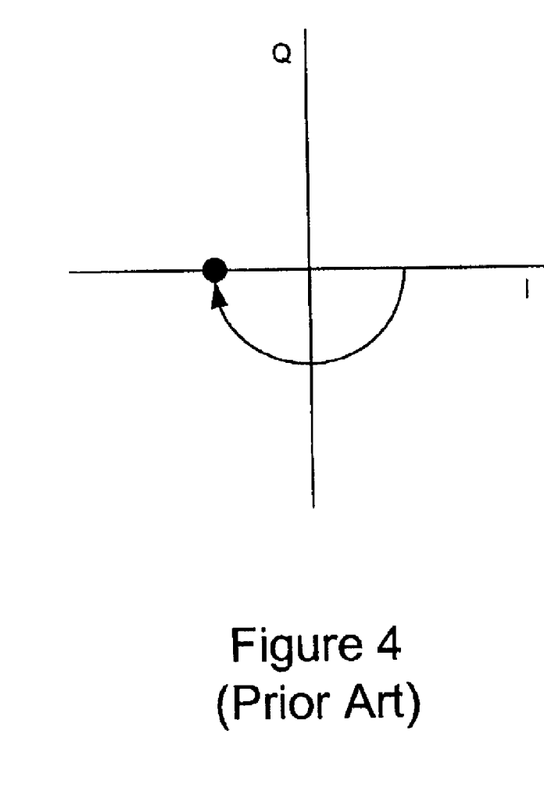
FIG. 4 illustrates one embodiment of a signal constellation for a CDMA system in which the angle of rotation is one hundred eighty degrees (180°)

If an initial frequency selected by the mobile station is outside of the capture range, the AFC system is unable to determine the direction of rotation of the signal constellation. FIGS. 3 and 4 illustrate signal constellations for a CDMA system in which the correlator output rotates around the origin by one hundred eighty degrees (180°) after each correlation length. When this happens, the AFC system cannot determine whether to increase or decrease the reference frequency generated by the VCTCXO. The AFC system may be unable to match the frequency of the reference signal to the frequency of the carrier signal transmitted by the base station. If the frequency of the reference signal does not match that of the carrier signal, the mobile station is unable to filter out the desired voice signal from the carrier signal.

SUMMARY OF THE INVENTION

A method and apparatus for compensating for an insufficient automatic frequency control (AFC) capture range is described herein. According to one aspect of the present invention, a mobile station determines if a transmission frequency is within the capture range. The transmission frequency may be the frequency of a CDMA signal transmitted by a base station. A reference frequency generated by the mobile station is modified by if the transmission frequency is not within the capture range.

Additional features and advantages of the present invention will be apparent from the accompanying drawings and from the detailed description that follows.

BRIEF DESCRIPTION OF THE DRAWINGS

The present invention is illustrated by way of example, and not by way of limitation, in the figures of the accompanying drawings and in which.

DETAILED DESCRIPTION OF THE INVENTION

In the following detailed description of embodiments of the invention, numerous specific details are set forth such as examples of specific materials, machines, and methods in order to provide a thorough understanding of the present invention. It will be apparent, however, to one skilled in the art that these specific details need not be employed to practice the present invention. In other instances, well known materials, machines, or methods have not been described in detail in order to avoid unnecessarily obscuring the present invention.

A method to compensate for an insufficient capture range and an automatic frequency control (AFC) system adapted to use the method are described herein. A reference frequency is set to an initial value and a lock timer is started. If a demodulator does not lock before the lock timer expires, the reference frequency is modified and the lock timer is started again. If the demodulator does lock before the lock timer expires, AFC is enabled and an unlock timer is started. If the demodulator does not remain locked until the unlock timer expires, the demodulator is reassigned and the lock timer is started again. If the demodulator does remain locked and the unlock timer expires, the frequency of the reference signal generated by the mobile station matches the frequency of the CDMA signal.

Figure 5A:
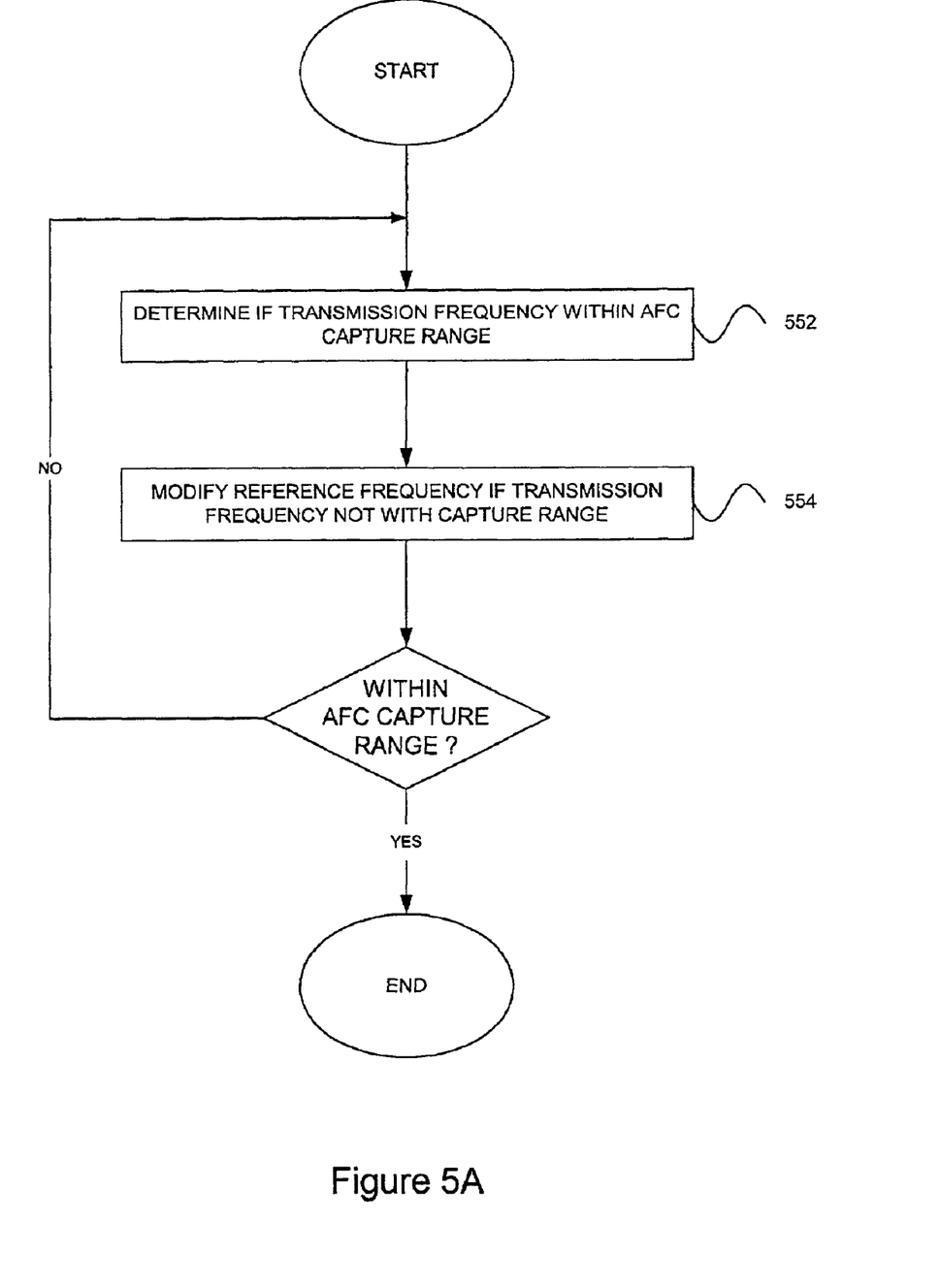
FIG. 5A is a simplified flow diagram illustrating one embodiment compensating for an insufficient capture range.

FIG. 5A is a simplified flow diagram illustrating one embodiment of a method for compensating for an insufficient capture range. A mobile station determines if a transmission frequency is within a capture range, 552. The transmission frequency may be the frequency of a CDMA signal received from a base station. The capture range of the mobile station may vary, depending upon the standard being used by the mobile station. For example, for CDMA 2000 3x, the capture range may be approximately 2.2 ppm. A reference frequency generated by the mobile station is modified if the transmission frequency is not within the capture range, 554. The reference frequency may be generated by a voltage-controlled temperature-compensated crystal oscillator (VCTCXO). The reference frequency may be modified by changing the control voltage of the VCTCXO. Determining if the transmission frequency is within the capture range, and modifying the reference frequency if the transmission frequency is not within the capture range, are described below in further detail with reference to FIG. 5B.

Figure 5B:
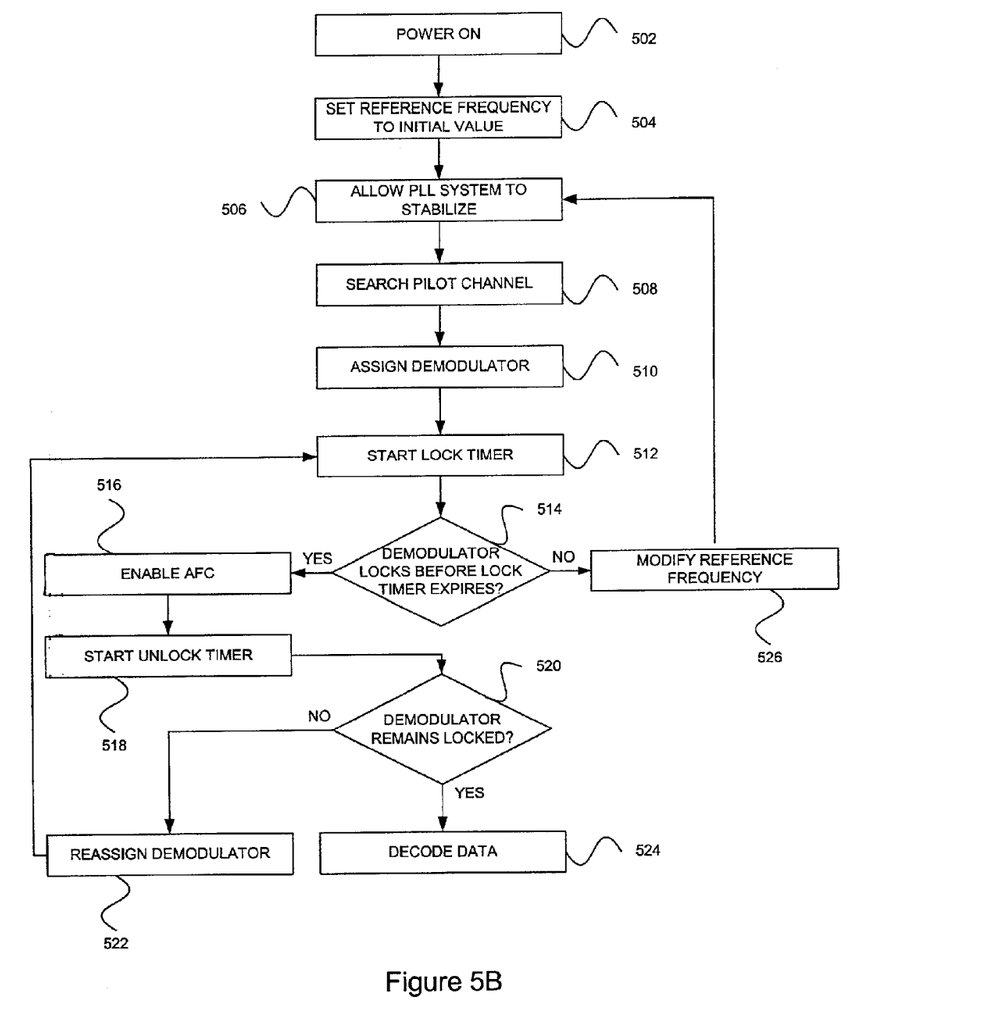
FIG. 5B is a flow diagram illustrating one embodiment of compensating for an insufficient capture range.

FIG. 5B is a flow diagram illustrating one embodiment of a method for compensating for an insufficient capture range. The method may be implemented in an AFC system in a mobile station such as a cellular telephone used in a wireless communications system such as a code division multiple access (CDMA) wireless communications system. Initially, the mobile station is powered on, 502. A reference frequency generated by the mobile station is set to an initial value, 504. The reference frequency may be provided to a phase locked loop (PLL) 658, 660, 662 to create a clock signal that drives the digital circuits in the mobile station. In one embodiment, the reference frequency may be set to an initial value by setting a low pass filter (LPF) 650 to an initial value. In one embodiment, the initial value of the reference signal may be the value of the reference frequency for the mobile station before the last power down. In another embodiment, the initial value may be a predetermined value that is always used when the mobile station is powered on. Alternative methods for selecting the initial value of the reference frequency will be apparent to one of skill in the art.

A clock in the mobile station is allowed to stabilize, 506. In one embodiment, the clock may be a voltage-controlled oscillator (VCO). In a further embodiment, the clock may be a voltage-controlled temperature-compensated crystal oscillator (VCTCXO). Pilot channel, which may be part of a CDMA signal received from a base station, is searched, 508. A searcher 626 in the mobile station may be used to search the pilot channel. The searcher may include a pseudo-noise sequence generator 620, a correlator 618, a comparator 622, and a sorter 624. Searchers are well known to those of skill in the art, and will be explained only as they pertain to the present invention. In one embodiment, a controller 628 coupled to the searcher contains software that sets the required variables in the searcher for searching the pilot channel.

A demodulator 652 is assigned using the results of the search performed by the searcher, 510. In one embodiment, the controller receives the results of the search performed by the searcher and provides the results to the demodulator. A lock timer, which may be in the demodulator, is started, 512. If the demodulator does not lock before the lock timer expires, 514, the reference frequency is modified, 526. In one embodiment, the reference frequency is increased one (1) ppm over the initial value the first time the lock timer does not expire, decreased one (1) ppm below the initial value the second time, increased two (2) ppm above the initial value the third time, decreased two (2) ppm below the initial value the fourth time, etc. Alternative methods for modifying the reference frequency will be apparent to one of skill in the art. After the reference frequency is modified, 526, the clock is allowed to stabilize, 506, pilot channel is searched, 508, the demodulator is assigned, 510, and the lock timer is started again, 512.

If the demodulator does lock before the lock timer expires, 514, automatic frequency control is enabled, 516. An unlock timer, which may be in the demodulator, is started, 518. If the demodulator does not remain locked, 520, the demodulator is reassigned, 522, and the lock timer is started again, 512. If the demodulator does remain locked, 520, automatic frequency control has converged to the correct frequency, and the system can begin to decode data 524.

Figure 6A:
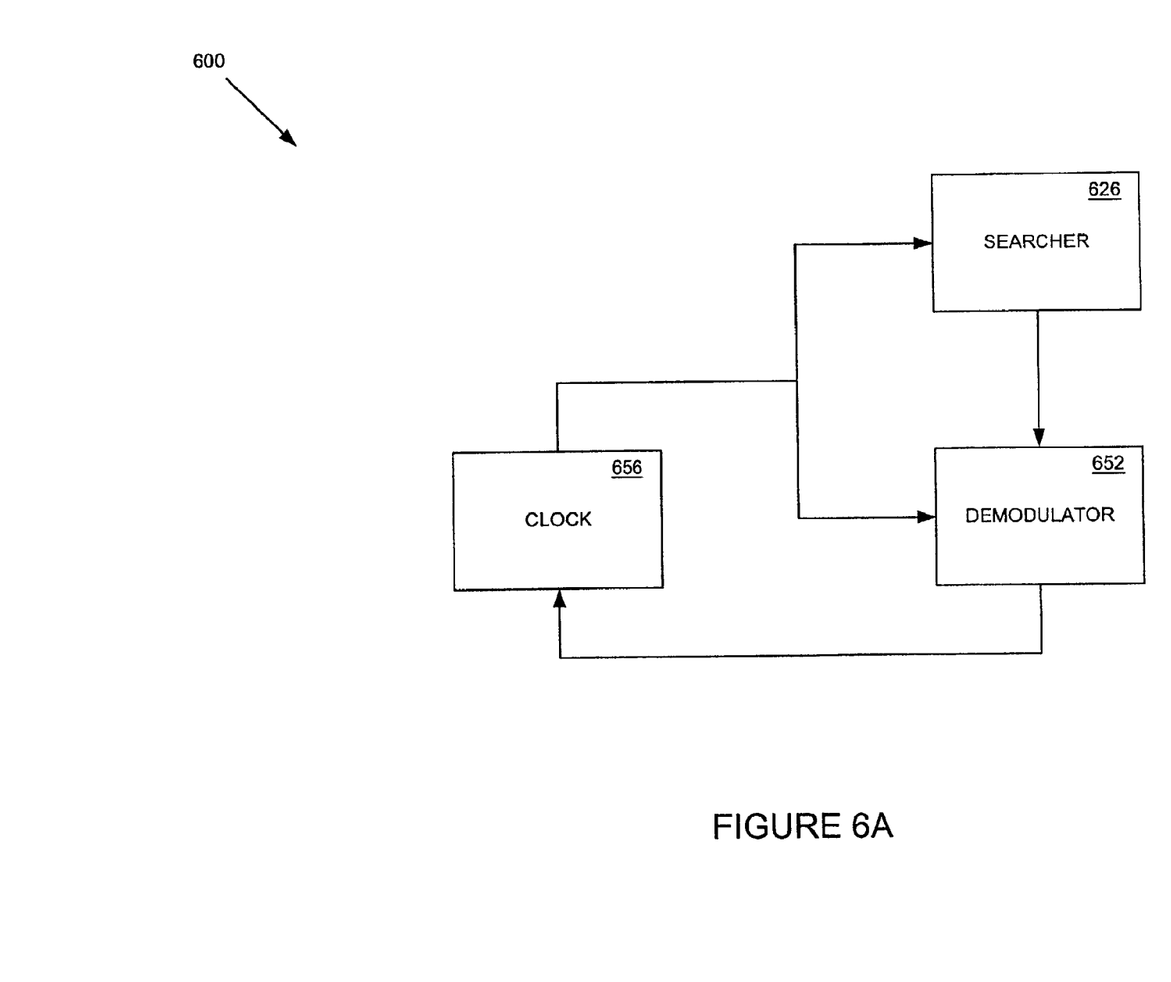
FIG. 6A is a simplified block diagram illustrating one embodiment of an automatic frequency control system adapted to compensate for an insufficient capture range.

FIG. 6A is a simplified block diagram illustrating one embodiment of an automatic frequency control (AFC) system 600 adapted to compensate for an insufficient AFC capture range. A demodulator 652 provides a negative feedback signal to a clock 656. In one embodiment, the demodulator may be part of a mobile station for use with a CDMA wireless communications system. Demodulator 652 may determine a frequency error between a CDMA signal transmitted by a base station, and a reference frequency generated by the clock 656. If the transmission frequency is outside a capture range, demodulator 652 may provide the negative feedback signal to clock 656 such that the reference frequency is modified by an incremental amount. In one embodiment, a searcher 626 provides a code timing to demodulator 652 that enables demodulator 652 to decode the CDMA signal transmitted by base station. Clock 656 provides a clock signal to searcher 626 and demodulator 652.

Figure 6B:
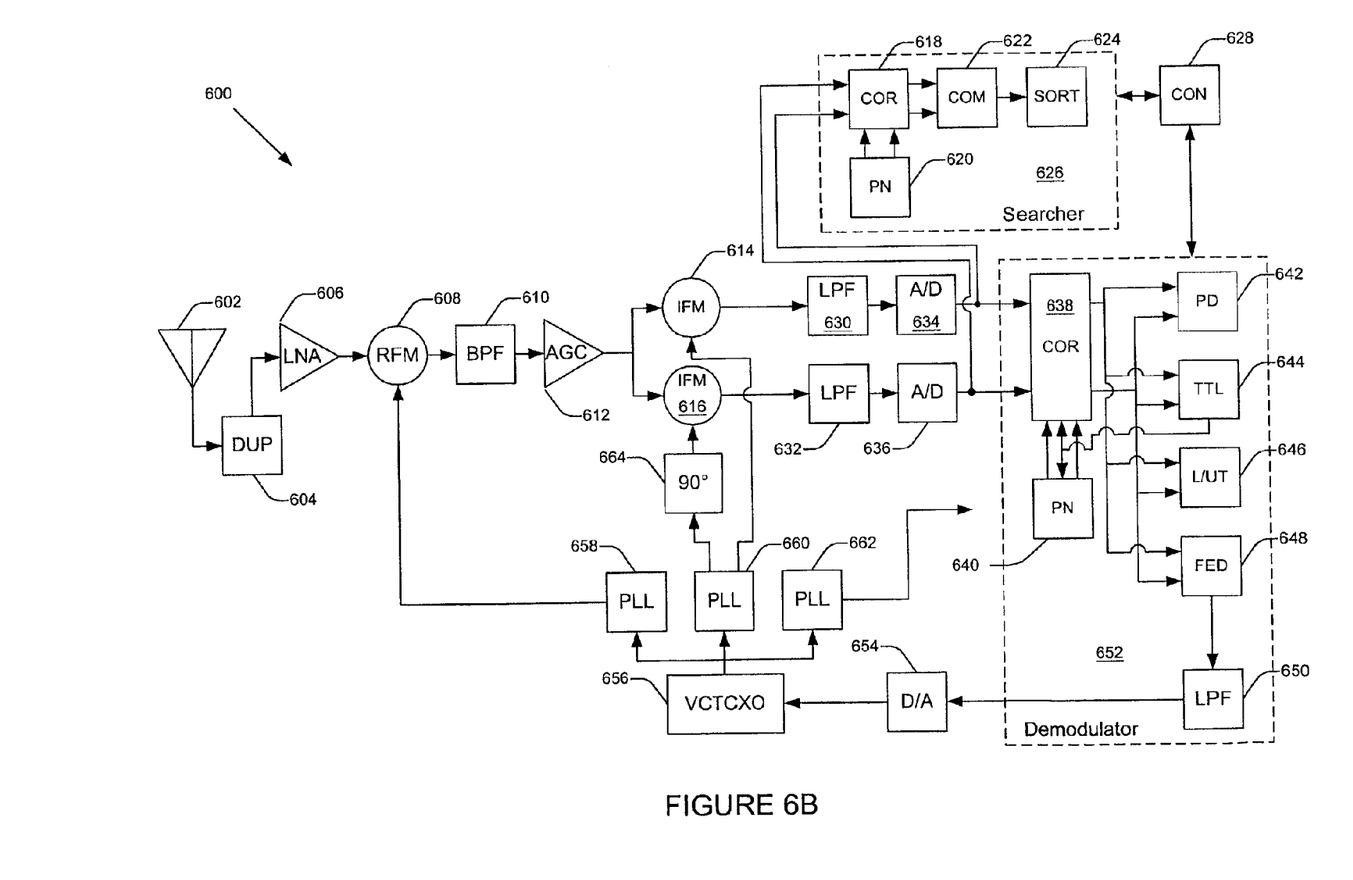
FIG. 6B is a block diagram illustrating one embodiment of an automatic frequency control system adapted to compensate for an insufficient capture range.

FIG. 6B is a block diagram illustrating one embodiment of an automatic frequency control (AFC) system 600 adapted to compensate for an insufficient AFC capture range. AFC system 600 can be implemented on a mobile station for a CDMA wireless communications system such as CDMA 2000 3x. Typically, the mobile station is a cellular telephone.

An antenna 602 receives a CDMA signal that may be broadcast from a base station. Antenna 602 provides the CDMA signal to a duplexer 604, which separates the CDMA signal from a transmit path. Duplexer 604 provides the CDMA signal to a low noise amplifier (LNA) 606 that amplifies the CDMA signal. LNA 606 provides the CDMA signal to an RF mixer 608, which converts the CDMA signal to intermediate frequency. RF mixer 608 provides the CDMA signal to a band pass filter (BPF) 610, which eliminates unnecessary low and high frequency signal components. BPF 610 provides the CDMA signal to an automatic gain control (AGC) 612 that adjusts the strength of the CDMA signal.

ACG 612 provides the CDMA signal to an in-phase intermediate frequency (I-IF) mixer 614 and a quadrature-phase intermediate frequency (Q-IF) mixer 616. I-IF mixer 614 and Q-IF mixer 616 convert the CDMA signal to base band and provide the I-CDMA and Q-CDMA signals, respectively, to low pass filters (LPFs) 630 and 632 that eliminate unnecessary high frequency signal components. LPFs 630 and 632 provide the I-CDMA and Q-CDMA signals to analog-to-digital (A/D) converters 634 and 636 that convert the I-CDMA and Q-CDMA signals from analog to digital form. A/D converters 634 and 636 provide the I-CDMA and Q-CDMA signals to a first correlator 618 and a second correlator 638 that calculates the correlation between the CDMA signal and PN sequences generated by a second PN sequence generator 640.

A first pseudo-noise (PN) sequence generator 620 generates an in-phase pseudo-noise (I-PN) sequence and a quadrature-phase pseudo-noise (Q-PN) sequence. First correlator 618 generates a first in-phase correlator (I-C) output and a first quadrature-phase correlator (Q-C) output. First correlator 618 provides the first I-C and Q-C outputs to a comparator 622. If the first I-C and Q-C outputs are greater than a threshold, comparator 622 provides the PN sequence associated with the first I-C and Q-C outputs to a sorter 624. Sorter 624 performs a sort of PN sequences whose first I-C and Q-C outputs exceed the threshold.

First correlator 618, first PN sequence generator 620, comparator 622, and sorter 624, are part of a searcher 626 within the mobile station. Searcher 626 performs initial acquisition of a pilot signal that is part of a CDMA signal transmitted from a base station. A controller 628 may control the timing of PN sequences generated by first PN sequence generator 620 during initial acquisition. Controller 628 may include a central processing unit (CPU) that executes software that sets the required variables in searcher 626 for performing initial acquisition. Results of the initial acquisition performed by searcher 626 may be provided to controller 628.

Second PN sequence generator 640 generates a second in-phase pseudo-noise (I-PN) sequence and a second quadrature-phase pseudo-noise (Q-PN) sequence. Second PN sequence generator 640 provides the second I-PN and Q-PN sequences to second correlator 638. Second correlator 638 multiplies the second I-PN and Q-PN sequences by the I-CDMA signal provided by I-IF mixer 614 and the Q-CDMA signal provided by the Q-IF mixer 616 to generate a second in-phase correlator (I-C) output and a second quadrature-phase correlator (Q-C) output.

Second correlator 638 provides the second I-C and Q-C outputs to a phase derotation unit 642, a time tracking loop 644, a lock/unlock timer 646, and a frequency error detection unit 648. Phase derotation unit 642 outputs a demodulated signal when initial acquisition is complete and time tracking is being performed accurately. Time tracking loop 644 controls the timing of second correlator 638 and second PN sequence generator 640. Lock/unlock timer 646 provides the criteria to determine whether or not to offset the value of the clock in the mobile station. Frequency error detection (FED) unit 648 uses the I-C and Q-C outputs to determine the frequency error between the mobile station and the base station. If there is a frequency error between the base station and the mobile station, FED unit 648 may provide a negative feedback signal to LPF 650, which eliminates unnecessary high frequency signal components. Second correlator 638, second PN sequence generator 640, phase derotation unit 642, time tracking loop 644, lock/unlock timer 646, FED unit 648, and LPF 650 are part of a demodulator 652 in the mobile station.

LPF 650 provides the negative feedback signal to a digital to analog (D/A) converter 654, which converts the negative feedback signal from a digital to an analog signal. D/A converter 654 may consist of a pulse density modulator and a low pass filter. D/A converter 654 provides the negative feedback signal to a clock 656. In one embodiment, clock 656 may be a voltage-controlled temperature-compensated crystal oscillator (VCTCXO). Typically, the control voltage for VCTCXO 656 may range from approximately 0V to 3V. The control voltage may be initially set to approximately 1.5V, which is in the middle of the control voltage range. The reference frequency generated by VCTCXO 656 corresponding to a control voltage of 1.5V may be approximately 19.68 MHz. The control voltage may be varied to modify the reference frequency generated by VCTCXO 656. For example, decreasing the control voltage from approximately 1.5V to approximately 1.2V may decrease the reference frequency by approximately 1 ppm. If the frequency at 1.5V were 19.68 MHz, then 1 ppm would equal 19.68 Hz.

In one embodiment, the reference frequency of VCTCXO 656 is set to an initial value. The reference frequency may be changed from this initial value by the negative feedback signal provided by demodulator 652. VCTCXO 652 may provide the reference frequency to a first phase locked loop oscillator (PLL) 658, a second PLL 660, and a third PLL 662. First PLL 658 generates a reference signal, which it provides to RF mixer 608. Second PLL 660 generates a reference signal, which it provides to I-IF mixer 614 and to a ninety-degree shifter 664. Ninety-degree shifter 664 shifts the phase of the reference signal by ninety degrees and provides the reference signal to Q-IF mixer 616. Third PLL 662 generates a reference signal, which it provides to demodulator 652 to modify the clock signal provided to PN sequence generator 640.

Thus, a method to compensate for an insufficient capture range and an automatic frequency control (AFC) system adapted to use the method have been described. Whereas many alterations and modifications of the present invention will be comprehended by a person skilled in the art after having read the foregoing description, it is to be understood that the particular embodiments shown and described by way of illustration are in no way intended to be considered limiting. References to details of particular embodiments are not intended to limit the scope of the claims.

What is claimed is:

1. A method for adjusting a reference frequency in an electronic device comprising:
   determining if a transmission frequency is within a capture range; and
   modifying the reference frequency if the transmission frequency is not within the capture range; and
   setting the reference frequency to an initial value, the initial value of the reference frequency is a previous reference frequency used by the electronic device and the previous reference frequency is a last reference frequency used by the electronic device prior to a last power down of the electronic device.

2. The method of claim 1 wherein the initial value of the reference frequency is a predetermined reference frequency.

3. The method of claim 1 further comprising allowing the reference frequency to stabilize.

4. The method of claim 1 further comprising performing a search of a pilot channel.

5. The method of claim 4 further comprising generating a search result.

6. The method of claim 4 wherein the pilot channel is part of a spread spectrum signal.

7. The method of claim 5 further comprising assigning a code sequence timing to a demodulator using the search result.

8. The method of claim 7 wherein the code sequence timing is a pseudo-noise sequence timing.

9. The method of claim 7 further comprising starting a lock timer.

10. A metohd for adjusting a reference frequency in an electronic device comprising:
    determining if a transmission frequency is within a capture range; and
    modifying the reference frequency if the transmission frequency is not within the capture range;
    setting the reference frequency to an initial value, initial value of the reference frequency is a previous reference frequency used by the electronic device; and
    performing a search of a pilot channel;
    generating a search result;
    assigning a code sequence timing to a demodulator using the search result;
    starting a timer lock; and
    if the demodulator does not lock before the lock timer expires
        modifying the reference frequency,
        allowing the reference frequency to become stabilize,
        performing another search of the pilot channel, and
        generating another search result.

11. The method of claim 10 wherein modifying the reference frequency comprises increasing the clock frequency by an incremental amount.

12. The method of claim 10 wherein modifying the clock frequency comprises decreasing the clock frequency by an incremental amount.

13. The method of claim 11 further comprising, if the demodulator does not remain locked when the unlock timer expires:
    reassigning the code sequence timing to the demodulator; and
    restarting the lock timer.

14. A method for adjusting a reference frequency in an electronic device comprising:
    determining if a transmission frequency is within a capture range; and
    modifying the reference frequency if the transmission frequency is not within the capture range;
    setting the reference frequency to an initial value, the initial value, of the reference frequency is a previous reference frequency used by the electronic device; and
    performing a search of a pilot channel;
    generating a search result;
    assigning a code sequence timing to a demodulator using the search result;
    starting a timer lock; and
    if the demodulator does lock before the lock timer expires, enabling automatic frequency control.

15. The method of claim 14 further comprising starting an unlock timer.

16. The method of claim 15 further comprising, if the demodulator does remain locked when the lock timer expires, decoding a CDMA signal.

17. A system comprising:
    a clock, and
    a demodulator coupled to the clock to provide a negative feedback signal to the clock such that a reference frequency generated by the clock is modified, the demodulator comprises;
    a correlator;
    a code sequence generator;
    a lock/unlock timer; and
    a frequency error detector.

18. The system of claim 17 wherein the code sequence generator is a pseudo-noise sequence generator.

19. The system of claim 17 wherein lock/unlock timer provides the criteria to determine whether to modify a reference frequency generated by the clock.

20. The system of claim 17 wherein the correlator determines an in-phase correlator output and a quadrature-phase correlator output.

21. The system of claim 20 wherein the correlator provides the in-phase correlator output and the quadrature-phase correlator output to the frequency error detector.

22. The system of claim 17 wherein the frequency error detection unit:

determines a frequency error between the clock and a base station; and generates the negative feedback signal.

23. The system of claim 22 wherein the frequency error detection unit provides the negative feedback signal to the clock.

24. The system of claim 17 further comprising a searcher.

25. The system of claim 24 wherein the searcher;

determines a code sequence timing; and provides the code sequence timing to the demodulator.

26. The system of claim 25 wherein the code sequence timing is a pseudo-noise sequence timing.

27. The system of claim 17 wherein the clock is a voltage-controlled temperature-compensated crystal oscillator.

* * * * *